United States Patent [19]

Burke et al.

[11] 4,001,537
[45] Jan. 4, 1977

[54] POWER CONTROLLER FOR MICROWAVE MAGNETRON

[75] Inventors: Robert Virgil Burke; Thomas Eugene Hester, both of Fort Wayne, Ind.

[73] Assignee: Litton Systems, Inc., Huntington, Ind.

[22] Filed: July 24, 1975

[21] Appl. No.: 598,865

[52] U.S. Cl. .............................. 219/10.55 B; 323/8; 323/24; 323/36; 331/86
[51] Int. Cl.² ........................................ H05B 9/06
[58] Field of Search ............... 219/10.55 B; 331/86, 331/87, 185, 186; 315/105; 323/8, 24, 34–36; 328/258, 262

[56] References Cited
UNITED STATES PATENTS

| | | | |
|---|---|---|---|
| 3,396,342 | 8/1968 | Feinberg | 328/262 |
| 3,543,141 | 11/1970 | Lawson | 323/24 |
| 3,651,371 | 3/1972 | Tingley | 219/10.55 B |
| 3,684,978 | 8/1972 | Otaguro | 331/185 |
| 3,729,651 | 4/1973 | Fricker et al. | 323/8 |
| 3,760,291 | 9/1973 | Levinson | 219/10.55 B |
| 3,793,531 | 2/1974 | Ferrigno | 323/24 |
| 3,872,277 | 3/1975 | Niu | 219/10.55 B |
| 3,898,553 | 8/1975 | Boggett | 323/24 |

OTHER PUBLICATIONS

*Appliance*, Feb. 1975, "Designed for Slow Cooking at Microwave Speed," by James Stevens.

*Primary Examiner*—Gerald Goldberg
*Attorney, Agent, or Firm*—Ronald M. Goldman

[57] ABSTRACT

A microwave magnetron operating circuit includes a high leakage reactance transformer having a secondary winding a capacitor connected in series with the secondary winding and means connecting the series combination of capacitor and secondary winding across heater cathode and anode terminals of a magnetron. A controlled semi-conductor switch such as a triac is connected electrically in shunt of the magnetron. Control means are provided to operate the triac to its current conducting state so as to conduct current in shunt of the magnetron. The control means includes a positionable control member, accessible to the user, for varying the time at which the controlled semi-conductor device is placed in its electrically conductive state so as to permit the user to adjust or set the power supplied to the magnetron to various different power levels.

8 Claims, 4 Drawing Figures

POWER CONTROLLER FOR MICROWAVE MAGNETRON

BACKGROUND OF THE INVENTION

This invention relates to adjustable power control for a microwave magnetron of the type used in a microwave oven.

The microwave oven is the familiar appliance used to heat or cook foods by exposure of the food to microwave energy radiation. For this purpose conventional microwave ovens employ an electronic vacuum tube known in the art as a magnetron. Simply stated the magnetron is a device having unidirectional carrying characteristics which converts DC voltage and current into energy of the microwave frequency range such as for example, 2,450 megahertz. That DC voltage and current is provided by the power supply which converts normal household line voltage typically 120 or 240 volts AC to the normal operating voltages on the order of 3,000 to 4,000 volts DC required in the operation of existing microwave magnetrons. In its essentials present microwave oven power supplies contain a transformer for stepping-up the 120 volt AC to the level of less than the required 3,000 to 4,000 volts, a voltage doubler-rectifier which provides the required DC voltage for the magnetron and a source of low voltage for the heater of the magnetron.

As is known microwave energy generated by the magnetron is taken from the magnetron output and transmitted either directly or indirectly into the oven chamber. The average power supplied to the magnetron is set within limits by the design of both the power supply and the magnetron and is generally directly related to the microwave output power thereby generated by the magnetron. It is known that adjustment of the microwave power can be made within limits by adjustment of the DC voltage and, hence, current level to the magnetron. Most microwave ovens in commercial use contain power supplies that employs a high leakage reactance transformer in combination with a modified half-wave voltage doubler known also as the villard circuit to rectify and double the voltage output of the high voltage transformer, and apply a high voltage DC to the magnetron. Examples of such circuits appear in patents to Fineburg U.S. Pat. No. 3,396,342. U.S. Pat. No. 3,651,317 to Tingley and U.S. Pat. No. 3,684,978 to Otaguro which have been made known to applicants.

Recent practice is to provide additional elements within the oven supply that permit the microwave oven user to adjust the average power of the magnetron as offering high or low power or a mode to permit adjustment to any power level. One example of the high to low power adjustment in this combination is illustrated in the aforesighted patent to Otagro U.S. Pat. No. 3,684,978 in which the series capacitance is changed from one value to another. Still another method is to employ a semi-conductor controlled switching device such as the bidirectional triax in the primary circuit of the transformer so as to initiate current in the transformer primary to thereby regulate the average amount of current into the power supply which arrangement is found in the Litton Microwave Ovens sold under the brand name "Vari-cook." It is noted that in the Vari-Cook Oven circuit a separate filament or heater transformer is required because of the limited current into the primary of the high voltage transformer and the expedient of having the filament winding combined as a separate winding upon the high voltage transformer cannot presently be employed. Additionally the use of pulse techniques inherent in the Vari-Cook structure to the primary winding of the transformer creates additional voltage stresses on the transformer insulation that are best avoided. Another method of controlling the current appears described in U.S. Pat. No. 3,760,291 to Levinson in which a variable resistor is included in the current path to the magnetron so that the magnetron operating current is varied as a function of level of resistance as has been made known to us. This circuit appears impractical in that rather expensive resistors are employed which consumes current and generates heat.

The present invention relates to the control of the average power output of the oven magnetron by controlling the voltage in the secondary side of the transformer. More particularly the invention provides a simple control that allows the user to selectively adjust the power level of a magnetron to a certain range. In so doing the filament voltage may be supplied by the simple winding on the same transformer structure that contains the high voltage winding. The primary pulse technique of the Vari-Cook structure is avoided improving reliability of the transformer in our opinion, and any line surges caused by lightning on the input line as might destroy semi-conductor type control devices connected in the primary circuit are believed minimized.

SUMMARY OF THE INVENTION

Briefly the present invention includes in a power supply of the type having a power transformer, more particularly a high leakage reactance transformer, for providing high voltage AC at its secondary winding, a capacitor in series with the secondary winding and one terminal of the magnetron, and a controlled semiconductor switching device, such as a triac, is connected electrically in shunt of the magnetron. Adjustable means are provided to supply gating signals to the switching device so as to turn the triac into its current conducting condition, so as to conduct current in shunt of the magnetron. In one specific aspect of the invention the adjustable control is responsive to the phase of the AC voltage at the secondary and supplies voltage to the gate of the switching device at a predetermined phase angle during each AC half-cycle. In a second aspect of the invention the control means contains structure to provide a gating voltage only at a predetermined phase during each alternate half-cycle. And in another invention a multi-vibrator is used to provide a gating voltage. The multi-vibrator provides an output to the triac for predetermined periods which may be less than a half-cycle of AC or for a period covering many AC cycles.

The foregoing objects and advantages of the invention as well as the structure characteristic of the invention briefly summarized above are better understood by giving consideration to the detailed description of the preferred embodiments of the inventions which follows considered together with the figures of the drawings.

DESCRIPTION OF THE PREFERRED EMBODIMENTS

Figure 1:
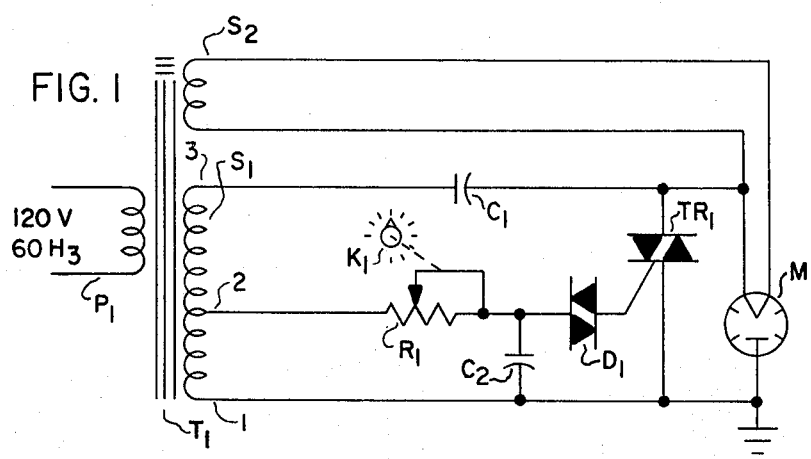
FIG. 1 illustrates schematically one embodiment of the invention.

The embodiment of FIG. 1 as well as the additional embodiments of the invention presented are illustrated in the form of an electrical schematic diagram using conventional graphical symbols for known elements to illustrate the invention clearly without the necessity of detailed and less informative mechanical illustrations. As is noted by the reader various elements of a microwave oven well known in the art are not illustrated in as much as they do not contribute to an understanding of the structure of the invention or its mode of operation. Thus in FIG. 1 a transformer T1, which is suitably the high leakage reactance type, includes a primary winding P1, a high voltage secondary winding S1 and a low-voltage secondary winding S2 often referred to as the heater or filament winding. A conventional magnetron M contains a heater-cathode assembly, an anode, and an output. The magnetron is suitably of the type for C.W. operation at a microwave frequency of perhaps 2450MHZ. a capacitor C1; a triac TR1, containing two main current conducting terminals and a gate terminal; a diac D1; and adjustable resistor R1, having a positionable tap as illustrated connected by means of a shaft, indicated by dash lines to a control knob K; and a capacitor C2 are included. Heater winding S2 is connected to the heater terminals of magnetron M so as to provide a closed electrical current conducting circuit through the magnetron filament. The magnetron anode is connected electrically to the circuit common or ground potential, as variously termed, and to one end 1 of transformer secondary winding S1.

Capacitor C1 is connected electrically in circuit between the other end 3 of secondary S1 and one of the heater cathode terminals of Magnetron M so as to form a series circuit of magnetron M, capacitor C1, and secondary S1. As is conventional the capacitor C1 is of a reactance greater than the leakage reactance of transformer T1. Triac TR1 is connected across the magnetron with one of its main current conducting terminals connected in circuit with a magnetron heater terminal and with the other terminal connected to the magnetron anode and, hence, to ground to place Triac TR1 electrically in shunt of the magnetron. At one end variable resistor R1 is connected to a low voltage tap 2 on secondary S1 and the other end of the resistor is connected in circuit with one terminal of diac D1 and on one side of capacitor C2. The remaining end of capacitor C2 is connected to ground. The remaining end of diac D1 is connected to the gate terminal of triac TR1. As is noted by the reader the circuit comprising resistor R1 and capacitor C2 is a conventional phase shifting circuit in which the degree of phase shift is a function of the level of resistance of R1 and the capacitance of capacitor C2. Hence an AC voltage applied at tap 2 to one end of resistor R1 is electrically out of phase with the voltage appearing across capacitor C2 the phase shifter output. The phase difference is adjusted by positioning knob K, accessible to the user, which sets the resistor tap, to different positions along the body of the resistance. The positionable tap as is shown is of the type which shunts or short circuits parts of the resistance so as to reduce the effective length of the resistor but other types of adjustable resistors may obviously be substituted as desired.

In operation primary winding P1 is connected to a suitable AC source suitably 120 volts 60 hertz that varies cyclically and sinusoidally in level with time. By transformer action the line voltage applied to the primary is step-down in level to a low AC voltage which appears across the secondary S2 and is stepped up in level to a high AC voltage which appears across secondary winding S1, and a low AC voltage is provided at secondary tap 2. The voltage across heater secondary S2 is applied to the filament of the magnetron so as to pass current through the filament and, after a sufficient period of time, the heating effect warms the magnetron cathode to the temperature at which sufficient electron emission occur in the magnetron. Initially it is noted that the output voltage across winding S1 is less than the normal operating voltage specified by the manufacturer for magnetron M. And a voltage doubling effect of the circuit is necessary in order to build up sufficient voltage across the magnetron to allow the magnetron to conduct current. It is recalled that the magnetron is a uni-directional current conducting device, like a diode, and conducts current only in a direction from its anode to its cathode.

At some predetermined phase of the AC voltage appearing at tap 2 of secondary S1, the voltage across capacitor C2 is of the predetermined level to cause the diac, a very sensitive semiconductor voltage breakdown device, to switch into a current conducting state placing a voltage at the gate of triac TR1 and discharge current from capacitor C2 passes through the diac to the gate electrode of triac TR1. Once the current through the diac reduces to zero, the diac restores to its "off" condition. In response to the triggering voltage and current at its gate triac TR1 is thus placed into its current conducting condition. Considering the voltage on the magnetron filament, to be positive relative to ground and end 1 of transformer winding S1, triac TR1 conducts current in a path from end 3, of secondary S1, through capacitor C1, the triac, to the other end 1 of secondary S1. In so doing the current charges up capacitor C1 to a high positive voltage at the ungrounded end or, viewed another way, charges the capacitor to a high negative voltage at the end connected to the magnetron heater. Thereafter the AC voltage across winding S1 reverses in polarity and commences to build up in instantaneous level. The voltage across winding S1 is additive with respect to the voltage appearing across recharged capacitor C1. Hence, the DC voltage applied across the magnetron essentially is increasing to a level greater than that across secondary S1. The polarity of the voltage across the magnetron now becomes positive on the anode with respect to the heater. As soon as the voltage builds up to an appropriate level the magnetron conducts current. Current then passes from the magnetron anode to its heater cathode through the capacitor C1, and secondary winding S1, which current discharges capacitor C1. In a conventional manner the magnetron converts such DC current to microwave energy which is taken at the output thereof and coupled to the microwave oven cavity, not illustrated. At some time during this second half-cycle of AC the voltage appearing across capacitor C2 again increases in level sufficient to again switch diac D1 to its "on" condition which in turn triggers triac TR1 to its "on" or current conducting state. Triac TR1 thus conducts current in a shunt path around magnetron M and the magnetron no longer generates microwave energy. This process repeats quickly.

By adjustment of knob K1 the position of the short circuit on variable resistor R1 and, hence the effective resistance of R1 is changed to vary the phase at which diac D1 and hence triac TR1 is placed in its electrically conductive state, so that on one half-cycle the amount of charge supplied into capacitor C1 is varied and the duration of current to magnetron M during the proceeding or alternate half-cycles is similarily varied in duration. By the aforedescribed operation the current effectively passed by the magnetron and converted into microwave energy is varied by simple adjustment of potentionmeter tap to vary the microwave output power.

Triac TR1 has another useful property in this circuit. The triac is inherently self protective against high voltage transients, thus if the voltage across its main terminal exceeds certain level known as the breakdown level of the triac, the triac switches into its current conducting condition, irrespective of the lack of a trigger voltage at the triac's gate input, and conducts current thereafter until the current through the terminals is reduced to zero at which time the triac again becomes non-conductive. Thus the high voltage which appears across the magnetron is dissipated by the triac to protect the transformer and other components from high voltage spikes. In accordance with the invention the reverse breakdown voltage of the triac selected is within the range of 110 to 200% greater than the normal operating voltage of magnetron M.

These high voltage transients occur usually during the warm up period of the magnetron filament or heater as variously termed. In order to have sufficient electrons within the tube for full operations the magnetron heater must be raised to the temperature level as specified by the manufacturer and in practice a magnetron does not reach its operating temperature for a period of perhaps 1 to 1½ seconds after heater current is supplied to the magnetron heater.

The power technique in which the high voltage is applied to the magnetron simultaneously with the application of the heater current to the magnetron filament is known as "cold-start" operation and appears in the embodiments of these inventions. However, at that time the magnetron filament is incapable of generating the level of electron emission necessary for proper operation of the magnetron. Thus although the voltage supplied between the anode and the heater-cathode of the magnetron is of the proper polarity and level the magnetron does not conduct current. As the magnetron's filament heats up greater numbers of electrons become available although still less than that required for full emission. During such time the magnetron conducts current only until the supply of electrons is exhausted and then ceases conducting. This occurs over a time period less than one-half AC cycle during which the DC voltage is applied across the magnetron. The sudden halt in the magnetron current generates high transient voltages, a phenomenon of the magnetron we term moding. These transient voltages are very high, possibly on the level of 3 to 4 times as large as the normal operating voltage of the magnetron.

In the prior power supply constructions a diode is connected in shunt of the magnetron which is replaced in the embodiment of the triac TR1. The diode used had reverse breakdown voltages in order of 12,000 to 20,000 volts so that the diode would not conduct in the reverse direction when the voltage transients appeared. By selecting the triac to have a voltage breakdown of between 10% greater than a normal operating voltage of the magnetron and twice the normal operating voltage of the magnetron, it is seen that the triac breakdown and conducts current to completely shunt the magnetron and divert any current which would otherwise be supplied by the source, through the series combination of secondary winding S1 and capacitor C1. Thus if the magnetron modes during the warm-up period the transient high voltage spike is dissipated through the triac and all current is shunted around the magnetron. This process re-occurs until the magnetron is up to its full operating temperature and the transients no longer appear.

It is noted in connection with the foregoing circuit that if power control is not desired but transient voltage suppression is desired the conventional half-wave doubler circuit of the prior art may be modified by substituting a reverse voltage breakdown characteristic substantially less than the 15 to 20,000 volt reverse breakdown voltage on diodes currently employed in the power supplies in accordance with the foregoing principles. Thus a triac type device should be used that is capable of carrying the forward current in one direction and which has a reverse breakdown voltage of the order 1.1 to 2 times the normal operation voltage of the magnetron specified by the magnetron manufacturer.

Figure 2:
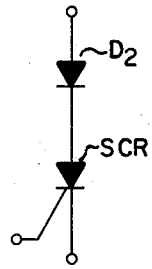
FIG. 2 illustrates schematically a modification for the embodiment of FIG. 1.

FIG. 2 illustrates the combination of a diode D2 and a silicon controlled rectifier SCR connected electrically in series and electrically poled in the same direction. This combination of elements may be substituted in the circuit of FIG. 1 for triac TR1 as well as in other embodiments in which a triac is employed. Other equivolent semiconductor switching devices may be substituted with or without minor circuit modifications. As is apparent current can pass through this circuit only in a direction from the anode of diode D2 to the cathode through the anode of the SCR and the cathode thereof. When SCR has the appropriate voltage applied at its gate, current can not flow in the reverse direction. With such a substitution the self-protective or transient suppressing characteristics, inherent in the embodiment of FIG. 1 due to the triac, is not available. Moreover in the operation of a circuit having the elements of FIG. 2 substituted for triac TR1, current flows through capacitor C1 to charge capacitor C1 only on the alternate AC half-cycles. Thus when the voltage at the filament of the magnetron is positive with respect to the anode of the magnetron in those half-cycles of AC, the magnetron does not normally conduct current. In contrast to the mode of operation described for the circuit of FIG. 1, the combination of diode D2 and silicon controlled rectifier SCR can not operate to shunt current from the magnetron during the AC half-cycles in which the voltage at the anode is positive with respect to the heater cathode.

Figure 3:
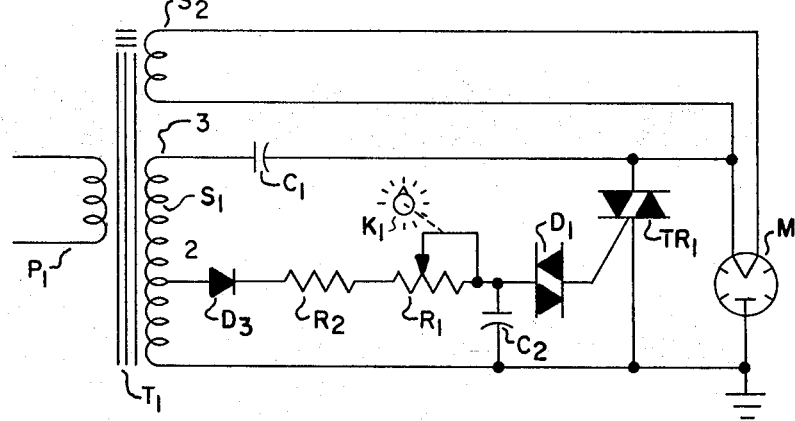
FIG. 3 illustrates schematically a second embodiment of the invention.

Reference is now made to the embodiment of FIG. 3. For convenience where the same elements used in the embodiment of FIG. 1 are employed, the same designation are used to identify the same elements and in the interest of brevity those elements are not redescribed. As is apparent from a comparison of the two embodiments the embodiment of FIG. 3 includes a diode D3 and a resistor R2 connected in series between tap 2 on secondary S1 and one end of potentiometer resistor R1 and the phase shifting circuit. Diode D3 is electrically poled so that its anode and is connected directly in circuit with the secondary winding tap. Resistor R2 is inserted in series circuit as a rough adjustment and adds to the resistance of R1. Diode D3 allows current to pass through the series circuit of resistor R2 and and R1 to charge capacitor C2. Only during those alternate half-cycles of AC as appears at tap 2 of transformer secondary S1 with respect to the ground in which the voltage at the tap is positive relative to ground. Accordingly capacitor C2 is charged sufficiently on alternate ones of the AC half-cycles to "fire" or cause diac D1 to breakdown and conduct current. As in FIG. 1, the operation of diac D1 discharges capacitor C2 through the gate of triac TR1 and thereby render triac TR1 conductive only on those same AC half-cycles. The phase angle of the AC at which triac TR1 switches to its current conducting condition is a function of tap position of adjustable resistor R1, as adjusted by the oven user by manipulation of knob K1. Thus on the one-half cycle AC as appears across secondary winding S1 when the voltage at the upper winding end 3 is positive relative to the grounded end 1, current passes through triac TR1, secondary winding S1 and capacitor C1 to charge capacitor C1 to a high negative voltage, limited in level to the level of voltage appearing across secondary S1, at the end of the capacitor connected to the magnetron heater terminal. Triac TR1 once "on" continues to conduct current until the current level there reduces to zero, after which the triac restores to its non-conducting condition. The triac then remains in the off condition until a trigger voltage is applied at its gate electrode to repeat the process. By varying the phase angle at which the triac TR1 is placed in its current conducting condition, the charge and hence the voltage across capacitor C1 may be adjusted in level. Suitably this adjustment is most pronounced at the line phase angles of between 70° and 120° so that there is insufficient time for the capacitor C1 to charge to high voltages. The described operation and structure has its roots in principle in the clamper circuits described Chapter 5, Pages 65 through 71 of the book entitled "Semi-conductor Pulse Circuits" Mitchell, published by Holt-Rinehart & Winston, Inc. 1970, which illustrates the principle of varying voltage levels in a general sense as applied to pulse type circuits.

On the next succeeding A.C. half-cycle the voltage appearing across secondary winding S1 rises sinusoidally in level but is opposite in polarity from the voltage in the preceding half cycle. The voltage across winding S1 is added to the voltage across capacitor C1 and the sum of these voltages are applied between the anode and the heater cathode of magnetron M. As is conventional when the voltage across the magnetron rises to the proper level and is of the proper polarity the magnetron conducts current through the path consisting of the magnetron, the main capacitor C1 and the secondary winding S1. The closed current path discharges the capacitor and the direct current through the magnetron is converted to high frequency microwave energy. Clearly the DC current through the magnetron depends upon the charge in capacitor C1. The charge applied to capacitor C1 through operation of the triac in succeeding half-cycles, is adjustable in level, hence also the current to the magnetron and the power output there of is similarily adjustable.

As in the preceding embodiment, the triac TR1 is preferably selected so as to have a breakdown voltage, a voltage at which the triac will conduct even though no trigger voltage is applied to its gate electrode, of between 110 and 200% of the normal operating voltage specified by the manufacturer for proper operation of magnetron M, to thus provide the transient voltage suppressing characteristics in the power supply during the initial warm-up period of the magnetron previously described.

It is noted that in connection with circuit of FIG. 2 that because of the mode of operation the effective impedance of the secondary winding as viewed from the primary may change and become more reactive so that the power factor of the circuit drops to an extent resulting in an increase in the primary current. It is believed that this primary current is still at an acceptable level. Nonetheless various compromises may be made in the circuit in proportioning and optimizing the various elements so that the primary power factor remains within acceptable levels. For example if the specific model of transformer found in the present Litton "Vari-Cook" Oven is employed as well as the existing capacitor and magnetron the application of the phase controlled triacs to that specific assembly results in a high peak current and full charge of capacitor C1, if the triac is turned "on" early in the first quadrant (90°) of the AC cycle due to the inherent effects of resonance like inter action between the capacitance of the capacitor and the leakage reactance of the transformer and that power variation may be adjusted within a range of 70° to 90° of the first quadrant. So doing provides the desired result of adjustability. It is obvious however that to eliminate this resonance effect the transformer design is modified to increase the leakage inductance of the transformer as by the addition of a larger magnetic shunt between the primary and secondary windings as is known to those skilled in the art. Having the disclosed invention before him, one skilled in the art obviously can attend to the details of optimization of design for any specific embodiment of the invention.

It is clear to the reader that the aforedescribed circuits provide power control with relatively few components. In as much as power control is obtained through electronic operations on the secondary side of the power transformer, the power control actions do not affect seriously the voltages appearing across the heater winding as occurs in those earlier power control designs in which the current applied to the primary was controlled or interrupted which would necessarily result in interruptions of heater current where the heater winding supplied by the same transformer in those preceding designs, which in fact required heater transformers separate from the high voltage transformer. Moreover a degree of isolation provided for the electronic components against line voltage surges occurring in the primary P1 due to ambient events, such as lightning striking the power lines of the electrical utility company.

Figure 4:
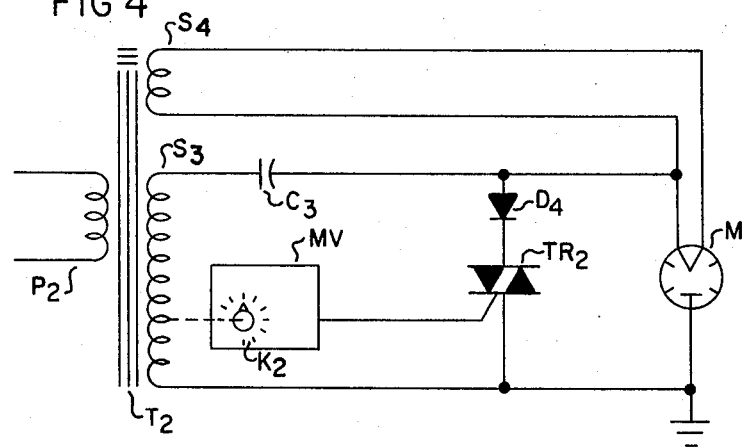
FIG. 4 illustrates schematically another invention.

Reference is next made to the invention presented in FIG. 4 which includes a high leakage reactance transformer T2 containing a primary winding P2, adapted to be connected to a source of 120 volts 60 hertz AC as available from local power utility company; a low voltage secondary winding S4 and a high voltage secondary winding S3. A magnetron M has its filament connected in circuit with the secondary winding S4. The magnetron anode is connected to one end of secondary S3 which is considered electrical common side of the circuit or ground as indicated by the symbol. A capacitor C3 is connected in circuit between the magnetron heater-cathode terminal and the other winding end of secondary. This is the basic circuit previously described in connection with the preceeding figures. A diode D4 and a triac TR2 are connected electrically in series between heater-cathode end of the magnetron and the ground or anode end of the magnetron. Diode D4 is electrically poled so that its anode is connected directly in circuit with the heater cathode end of the magnetron, so as to place Diode D4 in a reverse polarity relationship with the magnetron. A multi-vibrator is provided which is of any conventional structure as in represented by the rectangle. The multi-vibrator includes a control knob represented as K2 that is accessible to the microwave oven user. Suitably the multi-vibrator may be powered by any convenient electrical source and preferably is operated from voltage supplied by a tap on the secondary S3 as indicated by the dash line. The multi-vibrator output is connected to the gate end of triac TR2.

Preferably the multi-vibrator provides a square wave output voltage. With a positive output pulse having a duration of greater than many AC half-cycles such as for example one second. The multi-vibrator is adjustable to provide various durations of output voltage. For example a given setting of the multi-vibrator permits of a output which is positive for one second and then is zero for a second and repeats, so as to enable the gate electrode of triac TR2 for one second intervals and separated by intervals in which triac TR2 remains in its non conductive state. As control knob K2 is adjusted the output voltage duration changes let us say at another position of knob K2 to the output pulse will be at a duration of one-half second. As in the preceding examples the essential circuits functions in the conventional manner. The line voltage applied to the primary P2 is stepped down to the low AC voltage appearing across low voltage secondary S4 and is stepped up to the high voltage S3 typically less than the high voltage normal operating voltage specified for operation of magnetron M and a low voltage is provided at the tap. Considering the magnetron to be at operating temperature and considering the voltage at the upper end of winding S3 as seen in the illustration positive relative to ground and that the output pulse of multi-vibrator MV is applied to the gate electrode of triac TR2 to place triac in its electrically conductive condition and maintain it is its state for the duration, current flows from the upper end of winding S3 through capacitor C3, diode D4, triac TR2, and back to the secondary winding so as to allow capacitor C3 to fully charge as is known with the voltage.

The magnetron which exhibits diode like characteristics as is known does not conduct current on those half-cycles in which the voltage at its heater-cathode terminal is positive with respect to the anode. On the alternate half-cycle the voltage across winding S3 reverses in polarity and sinusoidally builds up in level just like the aforedescribed embodiments. The voltage across winding S3 is additive to the voltage appearing across capacitor C3, a result of the charge given the capacitor during the preceding AC half-cycle. When the sum of the voltages reaches the level necessary to cause the magnetron to conduct, the magnetron conducts current from its anode end to its heater-cathode end in the circuit including secondary winding S3, magnetron M and capacitor C3, to discharge the capacitor and to convert the DC current to the magnetron to microwave frequency energy which is conducted a way by an output circuit not illustrated. In this instance the diode D4 is electrically poled so as to prevent current from passing through the circuit consisting of diode D4 and triac TR2 in as much as the voltage at the anode end of diode D4 in this a c half-cycle is negative with respect to the cathode end. The operation continues with the magnetron conducting on one-half the AC and the circuit consisting of diode D4 and triac TR2 conducting on alternate AC half-cycles to charge the capacitor C3 until the output of multi-vibrator MV drops off and ceases for an interval. It is apparent that if the current through the magnetron continues for one second and then ceases for one second the magnetron is operated at essentially half power, over a given period of time. As an obvious modification to this circuit various equivalents may be substituted for the triac such as a series of slave triggered silicon controlled rectifiers not illustrated of the type described on Pate 164 of the SCR Manual 5th edition published by the General Electric Co. published in 1972. The purpose in so doing is to use a series of SCRs having relatively low voltage breakdown characteristics so that the reverse breakdown characteristic of the circuit is the sum of the individual breakdown characteristic thus should a triac be unavailable having suitable reverse voltage breakdown characteristic necessary to prevent current conduction during the alternate half-cycles as a result of any high voltage transients generated in the circuit during moding the series string of lower voltages SCR may be used instead. It is also noted that various multi-vibrators may be employed including a multi-vibrator having a variable time base as well as a variable pulse width.

It is believed that the foregoing description of the preferred embodiments of our invention is sufficient in detail to enable one skilled in the art to make and use same. It is expressly understood that our invention is not limited to those details presented in connection with the foregoing, inasmuch as various substitutions of equivalents, additions, and improvements become apparent to those skilled in the art upon reading this specification all of which embody our invention. Accordingly it is respectfully requested that our invention be broadly construed within the full spirit and scope of the appended claims.

What we claim is:

1. An adjustable power operating circuit for a microwave magnetron in a microwave oven, said magnetron having an anode terminal and a pair of heater-cathode terminals, and possessing unidirectional current-conducting characteristics between the anode and cathode thereof and operative to generate microwave frequency energy responsive to the application of a voltage of magnitude $V_n$ volts between the anode and cathode thereof in which the polarity of such voltage is negative at said cathode, comprising:
 a high leakage reactance transformer containing a primary winding, a low voltage secondary winding and a high voltage secondary winding;
 said primary winding being adapted for connection to an AC voltage source, which voltage is sinusoidally varying in polarity and of a period T;
 said low voltage secondary winding being connected in circuit with said heater terminals for supplying current thereto;
 said high voltage secondary winding for stepping up the voltage of said primary to a high AC voltage $V_s$, where $V_s$ is less than $V_n$ volts, appearing thereacross;

said high voltage secondary winding including a tap for providing a low AC voltage representative of the high AC voltage across said secondary winding;

capacitor means;

means connecting said secondary winding, said capacitor means and said magnetron in electrical series circuit;

electronic switching means, said electronic switching means having first and second main current-conducting terminals and a gate terminal, and possessing the characteristic of being responsive to a trigger voltage applied to its gate electrode for switching into an electrically conductive state substantially instantaneously relative to one-half the period of said AC source and which restores to the electrically nonconductive state responsive to the instantaneous value of current therethrough reducing to zero;

said first and second main terminals being connected, respectively, in circuit with said anode and cathode terminals, respectively, of said magnetron to place said electronic switching means in shunt of said magnetron;

phase shifting circuit means having an input and an output for introducing a phase shift between an AC signal applied at said input and an AC signal as appears at said output, said phase shifting circuit including:

adjustable means for permitting selective adjustment of the amount of said phase shift;

an accessible positionable control member;

scale means associated with said control member for visually representing power levels as a function of the position of said positionable control member; and means coupling said control member to said adjustable means to permit adjustment of said adjustable means as a function of the position of said control member;

means connecting said input of said phase shifting circuit to said tap on said secondary for providing an AC voltage to said input;

triggering means coupled to said gate terminal and to said output of said phase shifting network responsive to the output of said phase shifting network attaining a predetermined level during each AC cycle at a time when voltage at the magnetron heater-cathode is positive relative to the anode for providing a trigger voltage pulse at least once during each AC cycle to said gate terminal of said electronic switching means; whereby said capacitor may be charged to a voltage during the half cycle of AC which voltage is additive with the voltage $V_s$ in the next succeeding half cycle and the sum of which voltages is at least equal to $V_n$ volts.

2. The invention as defined in claim 1 wherein said adjustble means comprises a variable resistor.

3. The invention as defined in claim 1 further including diode rectifier means, said diode being connected in series between said tap on high voltage secondary winding and said input of said phase shifting network for supplying a.c. voltage to said phase shifting circuit only on those a.c. half cycles of voltage when said magnetron is in the non-conducting state.

4. The invention as defined in claim 1 wherein said electronic switching means comprises a diode and a silicon controlled rectifier connected in series and electrically poled in the same direction.

5. The invention as defined in claim 1 wherein said electronic switching means comprises a triac and wherein said triggering means comprises a diac and wherein said phase shifting circuit includes capacitor means.

6. The invention as defined in claim 5 wherein said magnetron has a normal operating voltage, $V_n$, triac has a voltage breakdown characteristic in the range of 1.1 to 2.0 times said normal operating voltage of said magnetron.

7. An adjustable power operating circuit for a microwave magnetron in a microwave oven, said magnetron having an anode terminal and a pair of heater-cathode terminals, and possessing unidirectional current-conducting characteristics between the anode and cathode thereof and operative to generate microwave frequency energy responsive to the application of a voltage of magnitude $V_n$ volts between the anode and cathode thereof in which the polarity of such voltge is negative at said cathode, comprising:

a high leakage reactance transformer containing a primary winding, a low voltage secondary winding and a high voltage secondary winding;

said primary winding being adapted for connection to an AC voltage source, which voltage is sinusoidally varying in polarity and of a period T;

said low voltage secondary winding being connected in circuit with said heater terminals for supplying current thereto;

said high voltage secondary winding for stepping up the voltage of said primary to a high AC voltage $V_s$, where $V_s$ is less than $V_n$ volts, appearing thereacross;

said high voltage secondary winding including a tap for providing a low AC voltage representative of the high AC voltage across said secondary winding;

capacitor means;

means connecting said secondary winding, said capacitor means and said magnetron in electrical series circuit;

triac switching means, said triac having first and second main current-conducting terminals and a gate terminal, and possessing the characteristic of being responsive to a trigger voltage applied to its gate electrode for switching into an electrically conductive state substantially instantaneously relative to one-half the periof of said AC source and which restores to the electrically nonconductive state responsive to the instantaneous value of current there-through reducing to zero and further possessing a characteristic reverse breakdown voltage in the range of 1.2 $V_n$ to 2.0 $V_n$;

said first and second main terminals being connected, respectively, in circuit with said anode and cathode terminals, respectively, of said magnetron to place said triac switching means in shunt of said magnetron;

phase shifting circuit means having an input and an output for introducing a phase shift between an AC signal applied at said input and an AC signal as appears at said output, said phase shifting circuit including:

adjustable resistance means for permitting selective adjustment of the amount of said phase shift;

an accessible positionable control member;

scale means associated with said control member for visually representing power levels as a function of the position of said positionable control member; and means coupling said control member to said adjustable resistance means for adjusting the resistance of said resistance means as a function of the position of said control member;

means connecting said input of said phase shifting circuit to said tap on said secondary for providing an AC voltage to said input;

triggering means coupled to said gate terminal and to said output of said phase shifting network responsive to the output of said phase shifting network attaining a predetermined level during each AC cycle at a time when voltage at the magnetron heater-cathode is positive relative to the anode for providing a trigger voltage pulse at least once during each AC cycle to said gate terminal of said triac switching means; whereby said capacitor may be charged to a voltage during the half cycle of AC which voltage is additive with the voltage $V_s$ in the next succeeding half cycle and the sum of which voltages is at least equal to $V_n$ volts.

8. A variable power operating circuit for a microwave magnetron of the type having an anode terminal and heater-cathode terminal, comprising:

a high leakage reactance transformer having a primary and a secondary winding, said secondary winding including a low voltage tap;

capacitor means;

means for connecting said capacitor means and said secondary winding electrically in circuit across said magnetron;

triac means, said triac means having a gate electrode and two main current-conducting terminals;

means connecting each of said respective main terminals in circuit with a corresponding one of the anode terminal and heater-cathode terminal, respectively, of said magnetron to place said triac in shunt of said magnetron;

rectifier diode means, selectively adjustable resistance means, and capacitor means, connected in series circuit between a low voltage tap on said secondary winding and an end of secondary winding;

diac means connected in circuit between the juncture of said resistance means and said capacitor means and said gate electrode of said triac means;

and an accessible positionable control member coupled to said adjustable resistance means for setting said adjustable resistance means.

* * * * *